(12) United States Patent
Karr et al.

(10) Patent No.: US 9,632,149 B2
(45) Date of Patent: Apr. 25, 2017

(54) MAGNETIC LAYER WITH GRAIN REFINING AGENT

(71) Applicant: Seagate Technology LLC, Cupertino, CA (US)

(72) Inventors: Brian William Karr, Savage, MN (US); Eric Walter Singleton, Maple Plain, MN (US); Qing He, Plymouth, MN (US)

(73) Assignee: Seagate Technology LLC, Cupertino, CA (US)

( * ) Notice: Subject to any disclaimer, the term of this patent is extended or adjusted under 35 U.S.C. 154(b) by 239 days.

(21) Appl. No.: 14/052,179

(22) Filed: Oct. 11, 2013

(65) Prior Publication Data

US 2014/0035572 A1    Feb. 6, 2014

Related U.S. Application Data

(63) Continuation of application No. 11/265,629, filed on Nov. 2, 2005, now Pat. No. 8,582,252.

(51) Int. Cl.
| | |
|---|---|
| *G11B 5/39* | (2006.01) |
| *G01R 33/09* | (2006.01) |
| *B82Y 10/00* | (2011.01) |
| *B82Y 25/00* | (2011.01) |

(52) U.S. Cl.
CPC ............ *G01R 33/098* (2013.01); *B82Y 10/00* (2013.01); *B82Y 25/00* (2013.01); *G11B 5/3909* (2013.01); *G11B 5/3912* (2013.01); *G11B 5/3932* (2013.01)

(58) Field of Classification Search
CPC .............. G11B 5/3912; G11B 5/3909; G11B 2005/3996; G11B 5/3903; G11B 5/3932; G11B 5/3906; G11B 5/39

USPC ....................... 360/319, 324–324.2
See application file for complete search history.

(56) References Cited

U.S. PATENT DOCUMENTS

| | | | |
|---|---|---|---|
| 5,701,223 A | 12/1997 | Fontana, Jr. et al. |
| 6,154,349 A | 11/2000 | Kanai et al. |
| 6,339,330 B1 | 1/2002 | Sato et al. |
| 6,525,532 B2 | 2/2003 | Sato et al. |
| 6,528,326 B1 | 3/2003 | Hiramoto et al. |
| 6,555,889 B2 | 4/2003 | Hiramoto et al. |
| 6,703,676 B2 | 3/2004 | Hirai et al. |
| 6,713,830 B2 | 3/2004 | Nishimura et al. |
| 6,721,147 B2 | 4/2004 | Aoshima et al. |

(Continued)

FOREIGN PATENT DOCUMENTS

| | | |
|---|---|---|
| JP | 2001006126 | 1/2001 |
| JP | 2004031605 | 1/2004 |

(Continued)

OTHER PUBLICATIONS

Office Action from the United States Patent and Trademark Office for U.S. Appl. No. 11/265,629 dated Mar. 14, 2008.

(Continued)

*Primary Examiner* — Will J Klimowicz
(74) *Attorney, Agent, or Firm* — Westman, Champlin & Koehler, P.A.

(57) ABSTRACT

A magnetic sensor includes a magnetic layer comprising magnetic material and a grain refining agent. The magnetic layer having a grain-refined magnetic layer surface. A layer adjacent the magnetic layer has a layer surface that conforms to the grain-refined magnetic layer surface.

17 Claims, 7 Drawing Sheets

(56) References Cited

U.S. PATENT DOCUMENTS

| | | | |
|---|---|---|---|
| 6,723,457 B2 | 4/2004 | Tanahashi et al. | |
| 6,724,585 B2 | 4/2004 | Hayashi | |
| 6,759,081 B2 | 7/2004 | Huganen et al. | |
| 6,759,148 B2 | 7/2004 | Tanahashi et al. | |
| 6,785,100 B2 | 8/2004 | Hiramoto et al. | |
| 6,791,792 B2 | 9/2004 | Takahashi | |
| 6,801,392 B2 | 10/2004 | Kawasaki et al. | |
| 6,801,415 B2 | 10/2004 | Slaughter et al. | |
| 6,818,458 B1 | 11/2004 | Gill | |
| 6,831,312 B2 | 12/2004 | Slaughter et al. | |
| 6,831,314 B2 | 12/2004 | Higo et al. | |
| 6,927,075 B2 | 8/2005 | Guo | |
| 7,001,680 B2 | 2/2006 | Gill | |
| 7,141,208 B2 | 11/2006 | Ueno et al. | |
| 7,149,105 B2 * | 12/2006 | Brown | H01L 43/08 257/295 |
| 7,201,947 B2 | 4/2007 | Liao et al. | |
| 7,276,384 B2 * | 10/2007 | Parkin | B82Y 25/00 257/295 |
| 7,304,359 B2 | 12/2007 | Kim et al. | |
| 7,315,053 B2 | 1/2008 | Hosomi et al. | |
| 7,333,306 B2 | 2/2008 | Zhao et al. | |
| 7,351,483 B2 | 4/2008 | Parkin | |
| 7,872,837 B2 * | 1/2011 | Gill | B82Y 10/00 360/324.11 |
| 7,986,498 B2 * | 7/2011 | Wang | B82Y 40/00 360/324.2 |
| 8,178,363 B2 * | 5/2012 | Wang | H01L 43/08 438/3 |
| 8,755,222 B2 * | 6/2014 | Kent | G11C 11/16 365/130 |
| 2001/0040780 A1 * | 11/2001 | Pinarbasi | B82Y 10/00 360/324.11 |
| 2002/0034055 A1 * | 3/2002 | Seyama | B82Y 10/00 360/324.11 |
| 2002/0126427 A1 * | 9/2002 | Gill | B82Y 10/00 360/324.12 |
| 2002/0132137 A1 | 9/2002 | Kawasaki et al. | |
| 2002/0186516 A1 | 12/2002 | Larson et al. | |
| 2003/0030945 A1 | 2/2003 | Heinonen et al. | |
| 2003/0043503 A1 | 3/2003 | Grigoryevich et al. | |
| 2003/0112564 A1 | 6/2003 | Granstrom | |
| 2003/0185046 A1 | 10/2003 | Nishiyama et al. | |
| 2004/0000682 A1 | 1/2004 | Chen et al. | |
| 2004/0041183 A1 | 3/2004 | Slaughter et al. | |
| 2004/0047086 A1 * | 3/2004 | Wang | B82Y 10/00 360/324.12 |
| 2004/0047089 A1 | 3/2004 | Singleton et al. | |
| 2004/0053077 A1 | 3/2004 | Kawasaki et al. | |
| 2004/0136232 A1 | 7/2004 | Hosomi et al. | |
| 2004/0184198 A1 | 9/2004 | Tetsukawa et al. | |
| 2004/0203256 A1 | 10/2004 | Yang et al. | |
| 2004/0212933 A1 | 10/2004 | Kim et al. | |
| 2004/0218309 A1 | 11/2004 | Seigler | |
| 2004/0252414 A1 | 12/2004 | Mao et al. | |
| 2004/0252418 A1 | 12/2004 | Horng et al. | |
| 2004/0262258 A1 | 12/2004 | Hoehn et al. | |
| 2005/0011308 A1 * | 1/2005 | Ueno | B82Y 25/00 75/246 |
| 2005/0024781 A1 | 2/2005 | Yi et al. | |
| 2005/0029108 A1 | 2/2005 | Kawasaki et al. | |
| 2005/0059170 A1 * | 3/2005 | Min | G11C 11/15 438/3 |
| 2005/0110004 A1 | 5/2005 | Parkin et al. | |
| 2005/0185454 A1 * | 8/2005 | Brown | H01L 43/08 365/171 |
| 2005/0280960 A1 | 12/2005 | Guo et al. | |
| 2006/0186496 A1 | 8/2006 | Ditizio | |
| 2006/0279981 A1 | 12/2006 | Diao et al. | |
| 2007/0015293 A1 | 1/2007 | Wang et al. | |
| 2007/0034919 A1 | 2/2007 | Wang et al. | |
| 2007/0047159 A1 * | 3/2007 | Zhao | B82Y 25/00 360/324.12 |
| 2008/0144234 A1 | 6/2008 | Lin | |
| 2008/0151442 A1 | 6/2008 | Mauri et al. | |

FOREIGN PATENT DOCUMENTS

| | | |
|---|---|---|
| JP | 2004346423 | 12/2004 |
| JP | 2005203443 | 7/2005 |

OTHER PUBLICATIONS

Office Action from the United States Patent and Trademark Office for U.S. Appl. No. 11/265,629 dated Aug. 14, 2008.
Final Office Action from the United States Patent and Trademark Office for U.S. Appl. No. 11/265,629 dated Jan. 12, 2009.
Office Action from the United States Patent and Trademark Office for U.S. Appl. No. 11/265,629 dated May 6, 2009.
Final Office Action from the United States Patent and Trademark Office for U.S. Appl. No. 11/265,629 dated Oct. 20, 2009.
Examiner's Answer from the United States Patent and Trademark Office for U.S. Appl. No. 11/265,629 dated Jul. 7, 2010.
Decision on Appeal from the United States Patent and Trademark Office for U.S. Appl. No. 11/265,629 dated Dec. 27, 2010.
Office Action from the United States Patent and Trademark Office for U.S. Appl. No. 11/265,629 dated Apr. 4, 2013.

* cited by examiner

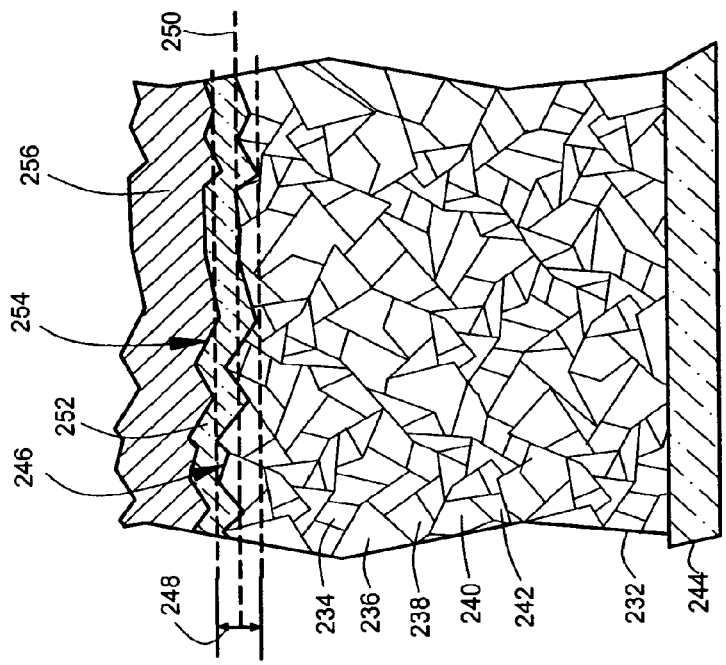
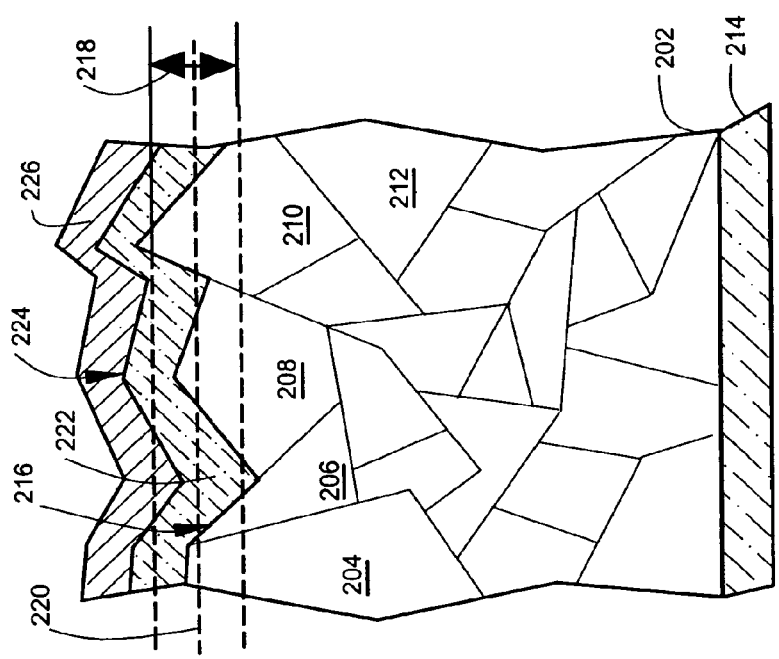
FIG. 2B
FIG. 2A
(Prior Art)

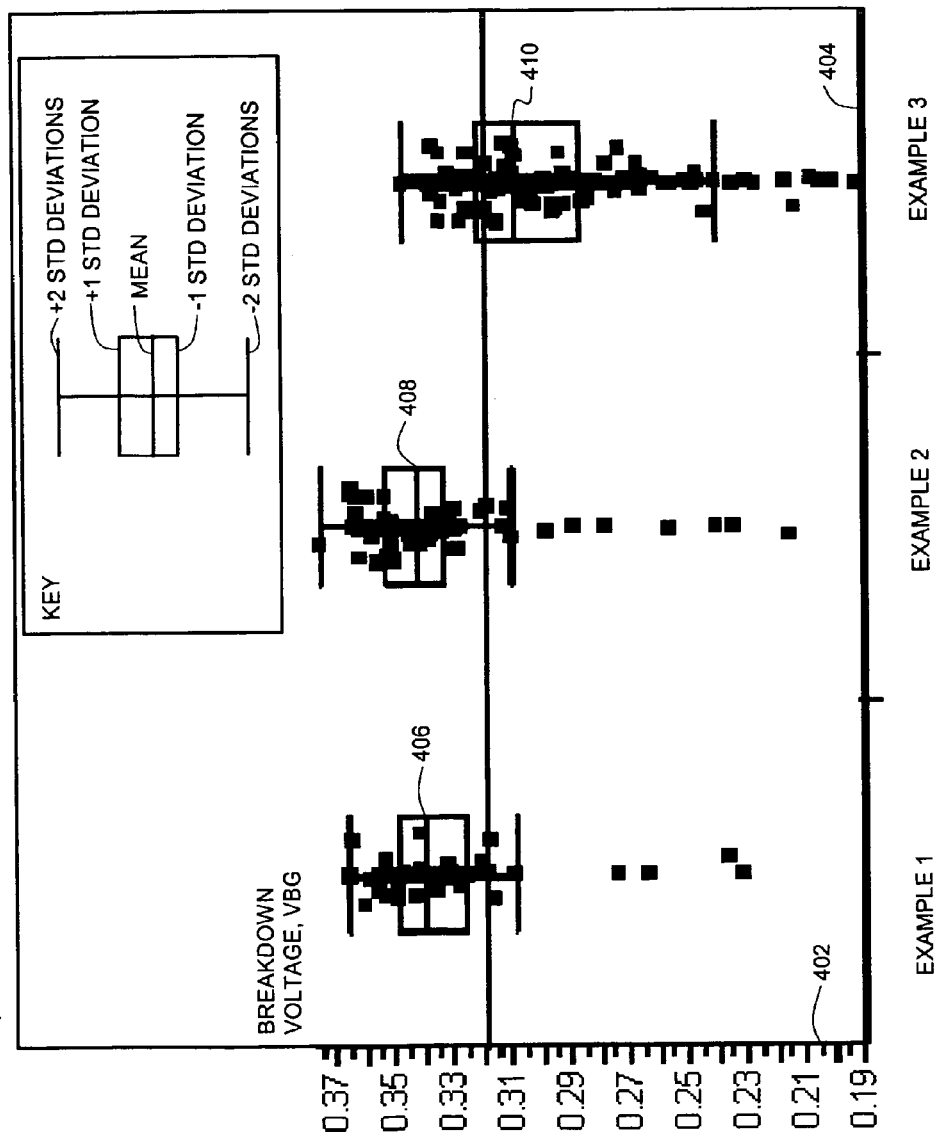

though a grain-refining agent may alter magnetic proper-
MAGNETIC LAYER WITH GRAIN REFINING AGENT

CROSS-REFERENCE TO RELATED APPLICATION

The present application is a continuation of and claims priority of U.S. patent application Ser. No. 11/265,629 filed on Nov. 2, 2005 entitled "Magnetic Layer with Grain Refining Agent," the content of which is hereby incorporated by reference in its entirety.

FIELD OF THE INVENTION

The present invention relates generally to thin film sensors, and more particularly, but not by way of limitation, to thin film magnetoresistive sensors.

BACKGROUND OF THE INVENTION

When tunneling magnetoresistive sensors are manufactured, a free layer and a barrier layer are adjacent a ferromagnetic layer. In known tunneling magnetoresistive sensors, the ferromagnetic layer has a surface roughness that is undesirably high for optimum performance of subsequently applied layers.

When the barrier layer is applied over this rough surface on the ferromagnetic layer, it is necessary to increase the thickness of the barrier layer to an undesirably high thickness to ensure that the barrier layer will be free of holes or other defects that could otherwise result in an electrical breakdown between the ferromagnetic layer (which is typically at a reference potential) and the free layer (which is typically at voltages other than the reference potential). Even with this increased thickness, the high roughness of the ferromagnetic layer is replicated, at least in part, in increased roughness of the top surface of the barrier layer. When the free layer is applied adjacent the barrier layer, the free layer also has increased roughness, resulting in undesired unit-to-unit variation of tunneling resistance of the barrier layer, and general decreased performance characteristics of the tunneling magnetoresistive sensor.

There is thus a problem with finding a material composition for a magnetic layer that provides desired magnetic properties, while at the same time providing a reduced surface roughness for the magnetic layer. A process and a magnetic material composition are needed which avoid undesired high surface roughnesses in various layers of the stack.

Embodiments of the present invention provide solutions to these and other problems, and offer other advantages over the prior art.

SUMMARY OF THE INVENTION

Disclosed is a magnetoresistive sensor. The magnetoresistive sensor includes a magnetic layer that comprises magnetic material and a grain refining agent. The magnetic layer has a grain-refined magnetic layer surface.

The magnetoresistive sensor includes a thin film stack adjacent the grain-refined magnetic layer surface. The thin film stack has a stack surface that conforms to the grain-refined magnetic layer surface.

In one embodiment, the thin film stack comprises a barrier layer with a first barrier layer surface that conforms to the grain-refined magnetic layer surface. In another embodiment, the barrier layer comprises an electrically insulating material. In yet another embodiment, the grain-refined magnetic layer surface comprises a surface roughness, and the barrier layer comprises a second barrier layer surface comprising a replicated surface roughness that replicates at least a portion of the surface roughness.

Other features and benefits that characterize embodiments of the present invention will be apparent upon reading the following detailed description and review of the associated drawings.

BRIEF DESCRIPTION OF THE DRAWINGS

FIGS. 2A and 2B illustrate highly enlarged, comparably sized cross-sectional views of a conventional magnetic layer (FIG. 2A) and a grain-refined magnetic layer (FIG. 2B).

FIG. 4 illustrates distributions of breakdown voltage characteristics for different lots of TMR sensors with and without addition of grain refining agent to a ferromagnetic layer.

DETAILED DESCRIPTION OF ILLUSTRATIVE EMBODIMENTS

Figure 1:
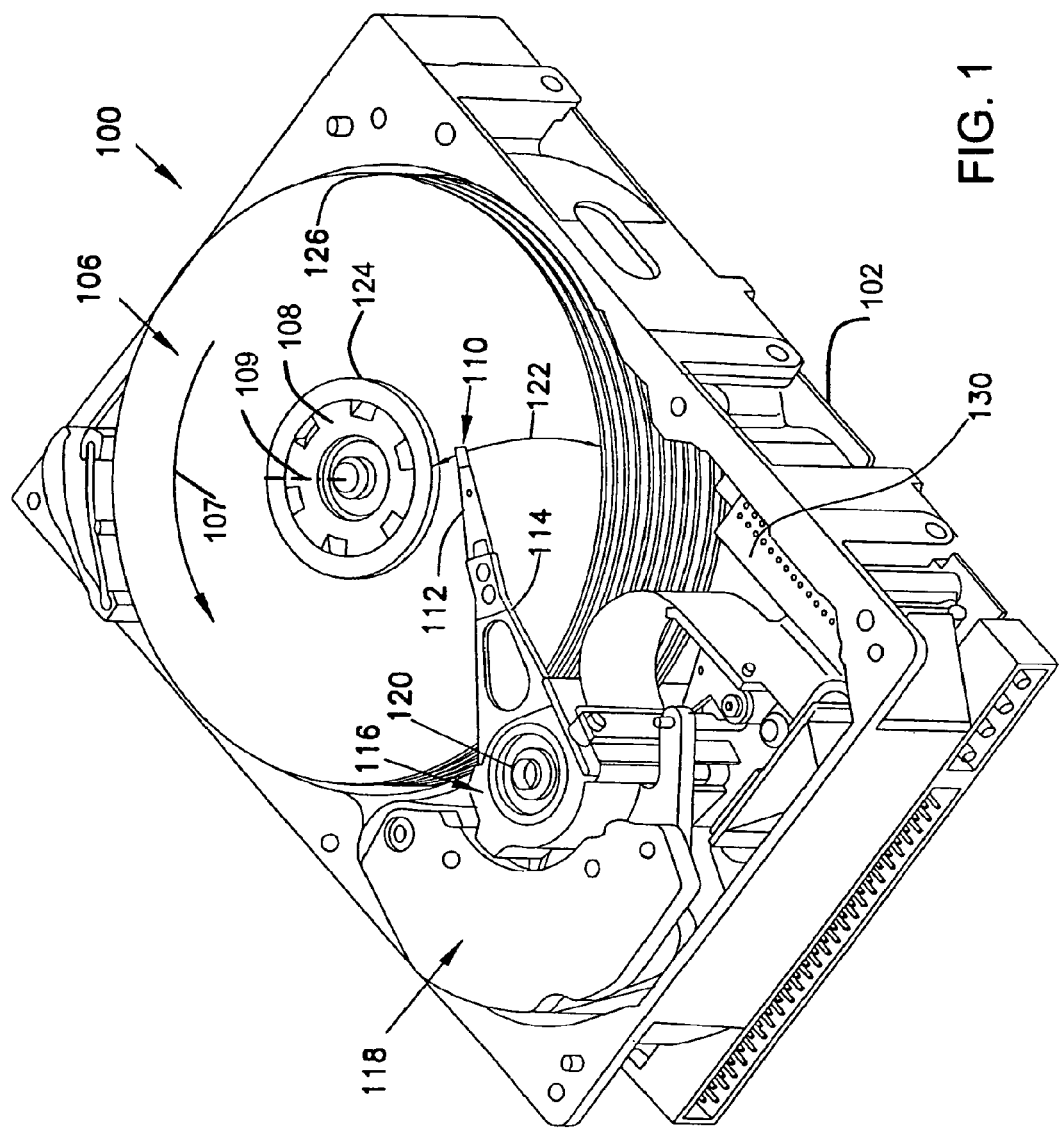
FIG. 1 illustrates an oblique view of a disc drive.

In the embodiments described below, a magnetic sensor has a magnetic layer that includes a grain refining agent, which provides a magnetic layer surface that is grain-refined to have a reduced surface roughness. The grain-refined magnetic layer surface is included in a thin film stack. The thin film stack has a stack surface that conforms to the grain-refined magnetic layer surface. Performance of one or more layers in the thin film stack is improved by the reduced surface roughness. Performance improvements can be more reliable electrical insulation for a selected insulation layer thickness, or less unit-to-unit variation of magnetoresistance for a selected geometry of a free layer, or a lower value of magnetoresistance for a given geometry.

As used in this application, the term "surface roughness" means the standard deviation of surface heights from an average surface height over a surface area of at least 10 square microinches. As used in this application, the term "magnetic material" means all known types of materials that have magnetic properties including but not limited to ferrimagnetic, ferromagnetic and antiferromagnetic materials.

In particular, tunneling magnetoresistance (TMR) sensors provide high amplitude output voltage, low electrical resistance, high thermal stability, and high voltage breakdown characteristics. These characteristics are desired for a variety of sensor applications, including recording heads, and magnetic random access memory devices. TMR sensor designs, which improve reliability and manufacturability, provide a useful technology that replaces existing current parallel-to-the-plane (CIP) sensor designs.

As the electrical resistance of TMR sensors is decreased, properties such as voltage amplitude, thermal stability, and resistance to bias voltage breakdown are degraded. As the requirements for reduced variation in electrical resistance requirements are narrowed with TMR design changes, device-to-device variation of tunneling magnetoresistance (TMR) and resistance-area product (RA) increases can be a significant yield issue. Free layers are applied adjacent a barrier layer that affects the TMR characteristics. Many TMR barrier layer materials, such as $Al_2O_3$, have been evaluated in an effort to improve these TMR sensor problems, however, less emphasis has been placed on optimizing a magnetic material layer over which the barrier is applied. The full potential of TMR sensors can, most likely, only be realized when materials in both the barrier and magnetic layers are optimized for best system performance.

In the embodiments described below, low resistance, high amplitude TMR sensors are formed as a stack utilizing a metal oxide barrier layer in conjunction with a grain-refined magnetic material layer. When a grain-refined magnetic material layer is used with a metal oxide barrier layer as described in the examples below, surface roughness is reduced, and resistance variance from device to device is reduced, especially at low RA (RA less than 5 Ohm-micron$^2$). When a grain-refined magnetic material layer is used with a metal oxide barrier layer, there is also increased magnetoresistance and improved thermal stability.

The grain-refined magnetic material can be obtained by low level elemental additions of grain refining agents that include, but are not limited to boron, niobium or hafnium, which induce a fine grain microstructure in magnetic layers. Low level additions of other substances that induce a fine grain microstructure can be used as well. At higher level elemental additions of boron, niobium or hafnium in a ferromagnetic material layer, an amorphous structure can be obtained, but such structures may not be stable. To achieve high TMR ratio, a Co—Fe based ferromagnetic layer is often preferred. Boron, niobium, hafnium or other grain refining agents can be added to a CoFe alloy to produce a fine grain microstructure.

In one preferred embodiment, $(Co_{100-x}Fe_x)_{100-y}R_y$ alloy ferromagnetic material can be used. In one embodiment, the composition range of interest includes alloys where x=0 to 50 atomic % and y=1 to 15 atomic %. In another embodiment, the composition range of interest includes alloys where x=0 to 50 atomic % and y=4 to 9 atomic %. Use of the grain-refining agent leads to reduced grain size and smoother interfaces. If used in these composition ranges the CoFeR forms a short range ordered or nano-crystalline ferromagnetic layer. This fine-grained structure has significant advantages over coarse-grained structures in that the grain boundaries of coarse-grained layers are thought to add significantly to the roughness of the film. The grain refining agent appears to increase the nucleation density or cause the formation of smaller grains due to the short-range diffusion, due to rejection as a result of limited solubility, from the CoFe alloy. Also, it is thought that the grain refining agent segregates to the grain boundaries inhibiting diffusion. The promotion of a fine-grained ferromagnetic layer is thought to lead to improvement in the degree of the conformal nature of the barrier layer as it is applied on the ferromagnetic layer. This type of structure can lead to a reduction in device to device variation in the TMR resistance distribution across a wafer where a large number of devices are fabricated, and it can also lead to an improvement in the voltage breakdown characteristics of the TMR devices. This is thought to be mainly due to the fact that a more conformal coating of barrier material will lead to a barrier which statistically has fewer defects for initiation of a breakdown event at low voltages. Elemental boron is a preferred material for the grain refining agent.

Bit transitions along a track on a magnetic storage disc (such as discs in disc pack 106 described below in connection with FIG. 1) produce magnetic fields external to the storage disc. These external magnetic fields can be sensed by a magnetoresistive sensor as it moves adjacent the bit transition. A wide variety of designs of magnetoresistive sensors can be constructed, and magnetic layers in these various designs can be enhanced by the use of grain-refining agents.

Magnetoresistive sensors have the advantage of providing a high level, high bit rate, high signal-to-noise ratio signal that has an amplitude that is relatively independent of the velocity of the disk medium. In addition, the magnetoresistive sensor is an active device in which bias current can be varied to adjust the level of the output signal. Magnetoresistive sensors can be shielded to provide mechanical equalization that increases maximum bit rate. Magnetoresistive sensors can also be used in combination with yoke structures.

As used in this application, the term "magnetoresistive sensor" refers to a stack of layers that includes one or more free layers and any adjacent layers included in the design such as, but not limited to, magnetic biasing layers, barrier layers, contact layers or shielding layers.

As used in this application, "free layer" refers to a layer that comprises magnetoresistive material that has a magnetization (also called "magnetic moment") that is free to rotate under the influence of an external magnetic field. The external magnetic field of a bit transition rotates the magnetic moment as the magnetoresistive sensor moves adjacent the bit transition. The rotation of the magnetic moment induces a change of electrical resistance of the magnetoresistive material.

As used in this application, "contact layer" refers to an electrically conductive layer that connect the magnetoresistive sensor to an external electrical circuit. The external electrical circuit senses resistance change and provides a bias current that flows though the free layer or layers.

As used in this application, "bias layer" refers to an optional layer that provides a magnetic field that shifts or rotates an initial magnetic condition of a free layer. A variety of bias arrangements can be used such as hard biasing (permanent magnets), shunt biasing, soft adjacent layer (SAL) biasing, barber pole biasing, dual striped biasing, pinning and pinned layers, or other known magnetic biasing techniques. Magnetic biasing can also include texturing of the magnetoresistive sensor itself.

As used in this application, "barrier layer" refers to a nonconductive layer that provides a high resistance barrier to flow of electrical current between adjacent ferromagnetic layers. A barrier layer is sufficiently thin that quantum mechanical tunneling of charge carriers occurs between the adjacent ferromagnetic layers. The tunneling process is spin dependent, which means that the tunneling current across the junction depends on the spin-dependent electronic properties of the adjacent ferromagnetic layers and is a function of the relative orientation of the magnetization directions of the two adjacent ferromagnetic layers.

In addition, magnetoresistive sensors may include additional layers that include but are not limited to seed layers that facilitate application of other layers and multilayer synthetic antiferromagnetic (SAF) layers. A SAF typically includes a fixed ferromagnetic layer, a spacer layer, a second ferromagnetic layer (such as a pinned layer) and an optional pinning layer. A SAF includes two ferromagnetic layers separated by a nonmagnetic spacer layer such that the two ferromagnetic layers are coupled to one another.

Magnetoresistive sensors may be constructed using thin film, electroplating, microstructure or nanostructure fabrication techniques, either alone or in combination with one another.

As used in this application, the term "head" refers to a complete read/write device that includes a magnetoresistive sensor and a write head.

As used in this application, the symbol "R" in chemical formulae refers to grain refining agent. Grain refining agents include but are not limited to boron, niobium and hafnium.

Figure 3A:
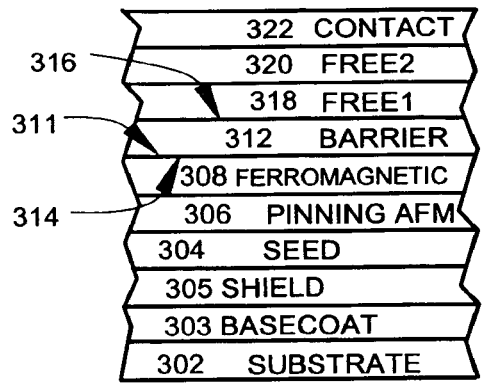
FIGS. 3A, 3B, and 3C illustrate cross sectional views of layers in embodiments of tunneling magnetoresistance (TMR) sensors.
Figure 3B:
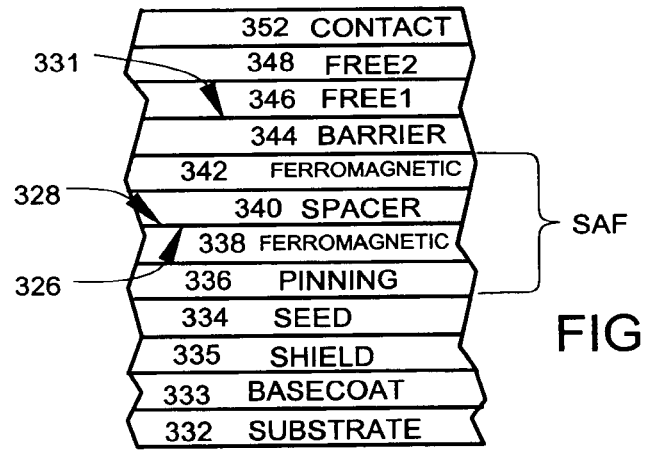
Figure 3C:
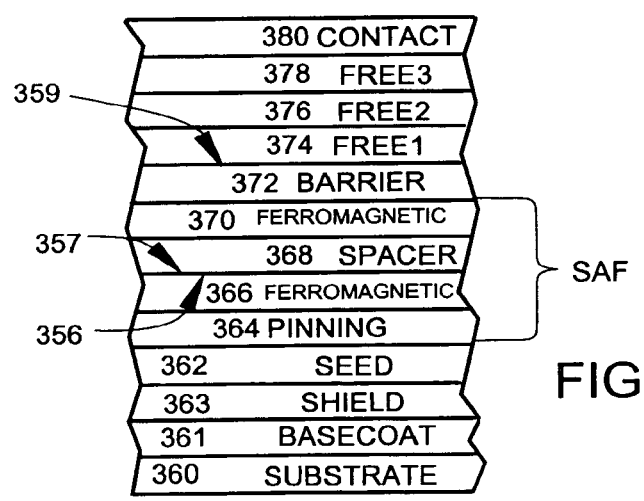

FIGS. 3A, 3B, 3C illustrate examples of magnetoresistive sensors in which layers that include grain refining agents may be used to enhance performance. The examples shown in FIGS. 3A, 3B, 3C are merely illustrative, and the layers that include grain refining agents can also be used in many other magnetoresistive sensors designs.

Magnetic layers including a grain refining agent can be utilized to completely replace a pinned layer 308 in a structure such as the one shown in FIG. 3A. Magnetic layers including a grain refining agent can be utilized to completely replace a pinned layer (such ferromagnetic layers 338 or 366 in FIGS. 3B, 3C) and/or a reference layer (such as ferromagnetic layers 342 or 370 in FIGS. 3B, 3C in a synthetic anti-ferromagnetic (SAF) structure. Magnetic layers including a grain refining agent can be utilized to replace a free magnetic layer such as any number of layers 318, 320, 346, 348, 374, 376, 378 in FIGS. 3A, 3B, 3C.

Magnetic layers can also be utilized in a laminated structure with magnetic layers (such as CoFe alloys) which do not contain such grain refining agents. These laminated structures can be utilized as a replacement for various magnetic layers including but not limited to pinned layers, reference layers, and free layers. For example, any structure can be laminated with CoFeR/CoFe layers including structures where the CoFeR is sandwiched between two CoFe layers or is part of a two-layer stack of CoFe and CoFeR (see FIG. 3B). Other possible laminate structures include CoFe/CoFeR/NiFe, CoFe/CoFeR/NiFe$_x$ (see FIG. 3C) where X is a number of elemental substitutions, and R is a grain refining agent. Boron is preferred as a grain refining agent.

FIG. 1 is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

FIGS. 2A, 2B illustrate highly enlarged, comparably sized schematic cross-sectional views of a conventional magnetic layer (FIG. 2A), and a magnetic layer (FIG. 2B) that includes a grain-refining agent.

In FIG. 2A, a magnetic layer 202 comprises magnetic material such as an alloy of cobalt (Co) and iron (Fe). The magnetic layer 202 can be applied adjacent a base layer 214 by sputtering, for example. The magnetic layer 202 does not include a grain refining agent, and grains (such as grains 204, 206, 208, 210, 212) of the magnetic layer 202 are relatively large. The magnetic layer 202 has a top surface 216 that has a surface roughness 218 that is affected by the relatively large size of the grains. Surface roughness is a measure the standard deviation of surface heights from an average surface height 220.

A barrier layer 222 is applied on the top surface 216 of the magnetic layer 202. The barrier layer 222 provides electrical insulation between the magnetic layer 202 and subsequently applied electrical conducting layers. The barrier layer 222 permits quantum mechanical tunneling of charge carriers. The barrier layer 222 may also provide a low permeability gap (comparable to an air gap) between the magnetic layer 202 and subsequently applied magnetic layers. The barrier layer 222 has a top surface 224 that, at least partially, replicates the surface roughness of the top surface 216. The thickness of the barrier layer 222 must be kept relatively thick in order to avoid electrical breakdown or magnetic leakage through the barrier layer 222.

A thin film layer 226 is applied on the top insulated surface 224. The thin film layer 226 typically comprises a free layer in a tunneling magnetoresistive device, but can comprise other layers, and can be used in other magnetic sensors. The surface roughness of the top insulated surface 224 is at least partially replicated in roughness and irregularities of layers in the thin film layer 226. The performance of the thin film sensor stack is degraded as a result of the roughness and irregularities. When large numbers of sensor devices are fabricated on a wafer using the techniques illustrated in FIG. 2A, there are large performance variations from one sensor device to another sensor device on a wafer due to the large surface roughness and irregularities.

FIG. 2A illustrates how the large grain size and surface roughness of a conventional magnetic layer 202 limit the performance of a thin film layer 226 and require an excessively thick barrier layer 222. As described below in connection with FIG. 2B, a composition of a magnetic layer is provided that does not result in these performance limitations.

In FIG. 2B, a magnetic layer 232 comprises magnetic material such as an alloy of cobalt (Co) and iron (Fe) that also includes a grain-refining agent. The magnetic layer 232 is applied on a base layer 244 by sputtering, for example. Grains (such as grains 234, 236, 238, 240, 242) of the magnetic layer 232 have a grain size that is controlled by the grain-refining agent and are relatively small in comparison with grains illustrated in FIG. 2A. The magnetic layer 232 has a grain-refined magnetic layer surface 246 that has a surface roughness 248 (relative to an average surface height 250) that is kept low by the relatively small size of the grains.

A barrier layer 252 is applied on the grain-refined magnetic layer surface 246 of the magnetic layer 232. The barrier layer 252 provides electrical insulation between the magnetic layer 232 and subsequently applied layers. The barrier layer 252 permits quantum mechanical tunneling of charge carriers. The barrier layer 252 may also provide a low permeability gap (magnetic spacing comparable to an air gap) between the magnetic layer 232 and subsequently applied magnetic layers. The barrier layer 252 has a top surface 254 that, at least partially, replicates the small surface roughness of the grain-refined magnetic layer surface 246, providing a relatively smooth top surface. The thickness of the barrier layer 252 can be varied from a relatively thin design to a relatively thick design without excessive electrical or magnetic leakage through the barrier layer 252.

A ferromagnetic layer 256 is applied on the top insulated surface 254. The surface roughness of the top insulated surface 254 is small. The performance of the sensor stack is improved as a result of the small surface roughness. The term "sensor stack" as used in this application refers to any number of layers that are applied over a substrate. When large numbers of magnetic sensors are fabricated on a wafer using the techniques illustrated in FIG. 2B, there are comparatively smaller performance variations (unit-to-unit) from one magnetic sensor to another magnetic sensor on a wafer.

FIGS. 3A, 3B, 3C illustrate bottom views of portions of thin film sensor stacks that include magnetic layers. The thin film sensor stacks shown in FIGS. 3A, 3B, 3C can be included in a head (such as head 110 in FIG. 1). The bottom views illustrated in FIGS. 3A, 3B, 3C preferably comprise portions of head surfaces that face magnetic media surfaces.

In FIG. 3A, a substrate 302 preferably comprises a slider body formed of AlTiC, or a layer applied to such a slider body. A basecoat layer 303, typically comprising alumina, and a shield layer 305 formed of magnetic material are applied on the substrate 302. A seed layer 304 is applied on the shield layer 305 in order to provide a chemically compatible surface for receiving an application of a pinning antiferromagnetic (AFM) layer 306.

A ferromagnetic layer 308 is applied adjacent the antiferromagnetic layer 306 and serves as a pinned layer. The magnetic layer 308 includes a grain refining agent as described above in connection with FIG. 2. In an exemplary embodiment, the grain-refining agent is preferably boron. The magnetic layer 308 has an grain-refined magnetic layer surface 311 which has a surface roughness that is reduced by the grain-refining agent.

A barrier layer 312 is applied adjacent the magnetic layer 308. The barrier layer 312 is preferably formed of an electrically insulating material such as alumina, and has a first barrier layer surface 314 that conforms to the grain-refined magnetic layer surface 311. The barrier layer 312 has a second barrier layer surface 316 that has a replicated surface roughness that replicates at least a portion of the surface roughness of the grain-refined magnetic layer surface 311. The replicated surface roughness of the second barrier layer surface 316 is reduced by the grain refining agent in the magnetic layer 308.

A first free layer 318 is applied adjacent the second barrier layer surface 316. The first free layer 318 preferably comprises CoFe. A second free layer 320 is applied adjacent the first free layer 318. The second free layer 320 preferably comprises an alloy that comprises NiFe or $NiFe_x$, where x is in the range of 2-30%, and preferably in the range of 18-22%. The surface roughnesses of the free layers 318, 320 are reduced by the grain refining agent in the magnetic layer 308. While the example shown in FIG. 3A includes two free layers 318, 320, it is understood that in other embodiments a single free layer can be used in place of the two free layers 318, 320. In general, the surface roughnesses of single or multiple stacked layers applied after the magnetic layer 308 are reduced by the presence of the grain refining agent in the magnetic layer 308. The performance characteristics of the thin film sensor stack 310 is improved by the reduced surface roughnesses, as described below in connection with FIGS. 4-7. A contact layer 322 is applied adjacent the second free layer 320. The contact layer 322 preferably comprises tantalum.

In FIG. 3A, a magnetic layer 308 that is a pinned layer is comprises a grain refined layer. It is understood that other layers such as a free layer, both a pinned layer and a free layer, or other layer combinations can comprise grain refined layers such as CoFeR. The pinned layer 308 can alternatively comprise a compound multilayer structure CoFe/CoFeR. The free layers 318, 320 can alternately comprise compound multilayer structures CoFe/CoFeR or CoFe/CoFeR/$NiFe_x$, where X is preferably in the range of 18-22%, or both the pinned layer 308 or free layers 318, 320 can comprise compound multilayer structures.

In FIG. 3B, a substrate 332 preferably comprises a slider body formed of AlTiC or another layer deposited on such a slider body. A basecoat layer 333, typically comprising alumina, and a shield layer 335 formed of magnetic material are applied on the substrate 332. A seed layer 334 is applied on the shield layer 335 in order to provide a chemically compatible surface for receiving an application of pinning layer 336.

A magnetic (or pinned) layer 338 is applied adjacent the pinning layer 336 and serves as a pinned layer. The magnetic layer 338 includes a grain refining agent. The grain-refining agent preferably comprises boron. The magnetic layer 338 has a grain-refined magnetic layer surface 328 which has a surface roughness that is reduced by the grain-refining agent. A barrier layer 344 is applied adjacent a magnetic layer 342. A spacer layer 340 and the reference (or magnetic) layer 342 are interposed between the magnetic layer 338 and the barrier layer 344. The barrier layer 344 is preferably formed of an electrically insulating material such as alumina. The spacer layer 340 has a spacer layer surface 326 that conforms to the grain-refined magnetic layer surface 328. The barrier layer 344 has a barrier layer surface 331 that has a replicated surface roughness that replicates at least a portion of the surface roughness of the grain-refined magnetic layer surface 328. The replicated surface roughness of the barrier layer surface 330 is reduced by the grain refining agent in the magnetic layer 338.

A first free layer 346 is applied adjacent the barrier layer surface 331. The first free layer 346 preferably comprises CoFe. A second free layer 348 is applied adjacent the first free layer 346. The second free layer 348 preferably comprises CoFeR, where R represents a grain-refining agent. The surface roughnesses of the free layers 346, 348 are reduced by the grain refining agent in the magnetic layer 308. In a preferred arrangement, the surface roughnesses of the free layers 346, 348 are further reduced by the use of grain refining agent in free layer 346. The performance is improved by the reduced surface roughness, as described below in examples in FIGS. 4-7. A contact layer 352 is applied adjacent the second free layer 348. The contact layer 352 preferably comprises tantalum.

In alternative embodiments, magnetic layers such as pinned layers, free layers, reference layers and compound free layers can comprise grain refining agents to provide reduced surface roughness. Other embodiments can be based on a synthetic antiferromagnetic (SAF) structure that includes grain refining agent use in a pinned layer (PL) only, a reference layer (RL) only, and a free layer (FL) only. Other embodiments include grain refining agents in a pinned layer and a reference layer, a pinned layer and a free layer, a reference layer and a free layer, or a pinned layer and a reference layer and a free layer. Each magnetic layer in the stack can also be formed using a compound of CoFe/CoFeR, including both reference layer and pinned layer, as well as compound free layer structures such as CoFe/CoFeR or CoFe/CoFeR/NiFe$_x$. These compound (laminated) layers can be inserted in any combination of pinned layer, reference layer, or free layer as previously described.

In FIG. 3C, a substrate 360 preferably comprises a slider body formed of AlTiC or a layer deposited adjacent such a slider body. A basecoat layer 361, typically comprising alumina, and a shield layer 363 formed of magnetic material are applied on the substrate 360. A seed layer 362 is applied on the shield layer 363 in order to provide a chemically compatible surface for receiving an application of a pinning layer 364.

A magnetic layer 366 is applied adjacent the antiferromagnetic layer 364 and serves as a pinned layer. The magnetic layer 366 includes a grain refining agent. The grain-refining agent preferably comprises boron. The magnetic layer 366 has a grain-refined magnetic layer surface 357 which has a surface roughness that is reduced by the grain-refining agent.

A barrier layer 372 is applied adjacent the magnetic layer 366. A spacer layer 368 and a reference (or magnetic) layer 370 are interposed between the magnetic layer 366 and the barrier layer 372. The barrier layer 372 is preferably formed of an electrically insulating material such as alumina. The spacer layer 368 has a first spacer layer surface 356 that conforms to the grain-refined magnetic layer surface 357. The barrier layer 372, the reference layer 370 and the spacer layer 368 have surfaces with surface roughnesses that replicate at least a portion of the surface roughness of the grain-refined magnetic layer surface 357. The replicated surface roughnesses of the surfaces of the barrier layer 372, the reference layer 370 and the spacer layer 368 are reduced by the grain refining agent in the magnetic layer 338.

A first free layer 374 is applied adjacent a second barrier layer surface 359. The first free layer 374 preferably comprises CoFe. A second free layer 376 is applied adjacent the first free layer 374. The second free layer 376 preferably comprises CoFeR, where R represents a grain-refining agent. A third free layer 378 is applied adjacent the second free layer 376. The third free layer 378 preferably comprises NiFe$_x$. The surface roughnesses of the free layers 374, 376, 378 are reduced by the grain refining agent in the magnetic layer 366. The surface roughness of the free layers 374, 376, 378 can be further reduced by the use of a grain refining agent in free layer 374. The performance is improved by the reduced surface roughness, as described below in connection with examples in FIGS. 4-7. A contact layer 380 is applied adjacent the third free layer 378. The contact layer 380 preferably comprises tantalum.

In FIG. 3C, CoFeR can be used in the pinned layer, the reference layer, and in tri-layer compound free layer structures. Grain refining agents can be used in other structures based on a synthetic antiferromagnetic layer, which can include tri-layer structures, a pinned layer or a reference layer. Other combinations where a grain refining agent can be used include use in pinned layer and reference layer, pinned layer and free layer, reference layer and free layer, pinned layer and reference layer and free layer(s).

Figure 5:
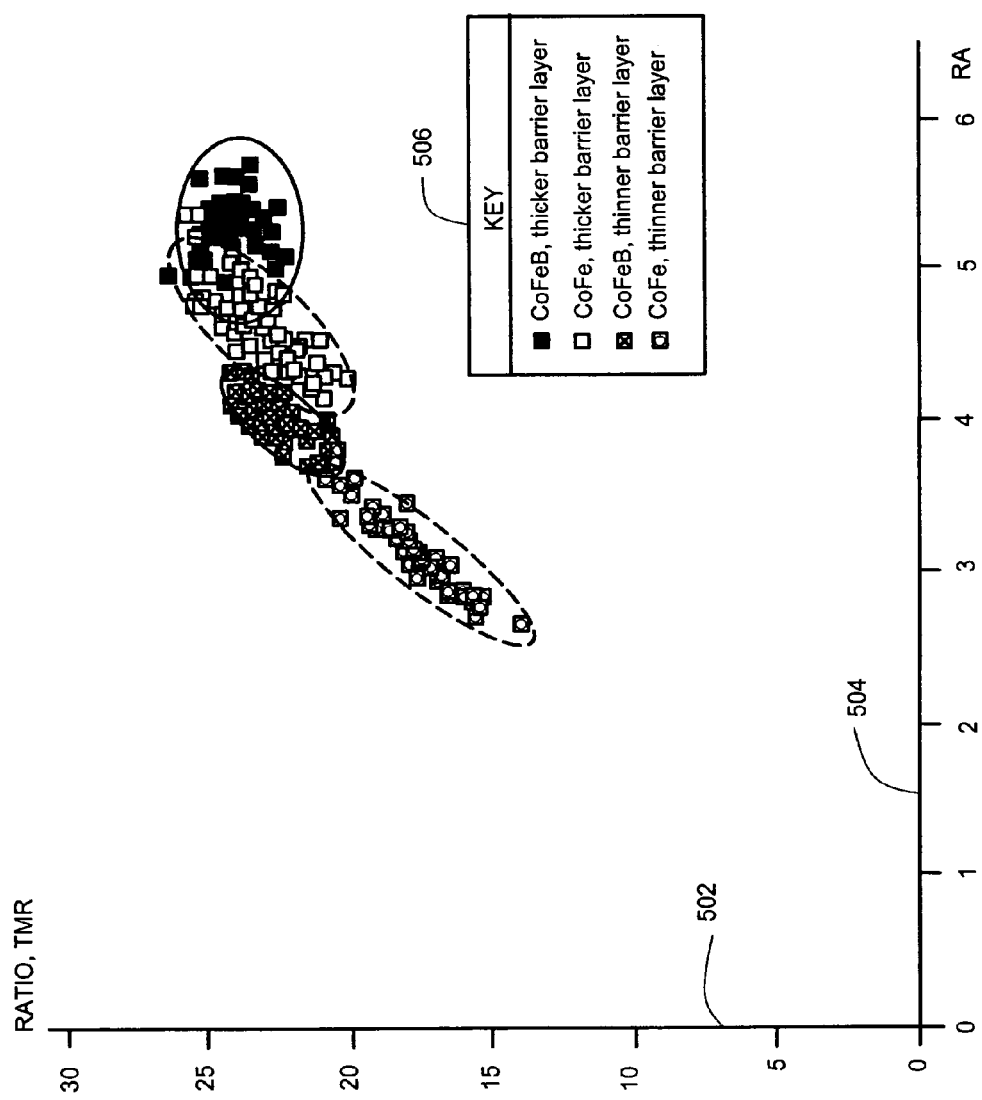
FIG. 5 illustrates a graph of tunneling magnetoresistance as a function of resistance area product for lots of TMR sensors with and without addition of grain refining agent to a ferromagnetic layer.

Also, resistance and amplitude for CoFeR ferromagnetic layer is superior to that with conventional ferromagnetic alloy layer. This is shown in FIG. 5, for CoFeB and CoFe ferromagnets when utilizing a Al$_2$O$_3$ barrier.

It will be understood that the layered structures illustrated in FIGS. 3A, 3B and 3C are merely exemplary, and that numerous other layered structures can be used with and benefit from the presence of an underlying magnetic layer with a grain-refined magnetic layer surface. The magnetic layer with the grain-refined magnetic layer surface may be any underlying magnetic layer such as a shield layer, a pinned layer, a reference layer, a free layer or other magnetic layer. It is also understood that a magnetic layer may comprise a first sublayer which is not grain-refined and a second sublayer that is grain-refined to provide the desired grain-refined magnetic layer surface upon which additional layers may then be applied.

It will also be understood that each layer in FIGS. 3A, 3B, 3C has an appropriate thickness and is selectively applied to selected geometric regions to provide a magnetic sensor as is known in the art.

FIG. 4 illustrates distributions (also called scattergrams) of numerical values of breakdown voltage for tunneling junctions for different lots of TMR sensors with and without addition of boron as a grain refining agent R to a magnetic layer. A vertical axis 402 represents numerical values of breakdown voltages and distributions of breakdown voltages for three example lots 1, 2, 3 are displayed along the horizontal axis 404.

Example lot 1 at 406 comprises a magnetic layer of CoFe, with 4% boron included as a grain-refining agent, that is deposited on a barrier layer. the Example lot 1 has a nominal resistance area product RA of 1.5. Example lot 1 has a mean breakdown voltage of 0.325 volts.

Example lot 2 at 408 comprises a magnetic layer of CoFe, with 4% Boron included as a grain-refining agent R, deposited on an barrier layer that comprises TiO. Example lot 2 has a nominal resistance area product RA of 2.25. Example lot 2 has a mean breakdown voltage of 0.330 volts.

Example lot 3 at 410 comprises a magnetic layer of CoFe (that does not include a grain-refining agent) and that is deposited on an barrier layer that comprises TiO. Example lot 2 has a nominal resistance area product RA of 1.5. Example lot 2 has a mean breakdown voltage of 0.310 volts.

As can be seen from inspection of FIG. 4, the breakdown voltage increased by about 6% with the addition of the grain refining agent boron. There is also less scatter in the numerical values of the breakdown voltage for the 64 devices tested in each example lot that included the boron grain refining agent.

FIG. 5 illustrates a graph of tunneling magnetoresistance ratio (TMR) as a function of resistance area product (RA) for lots of TMR sensors with and without addition of elemental boron as a grain refining agent R to a magnetic layer. A vertical axis 502 indicates TMR and a horizontal axis 504 indicates resistance area product. For a particular geometry, resistance area product corresponds with measured magnetoresistance. As indicated in the key 506, data points for four example lots of 64 tunneling magnetoresistors are shown. As indicated by the key, the TMR and RA properties vary depending on the presence or absence of the grain-refining agent boron, and also on thickness of a barrier layer comprising Al$_2$O$_3$. The resistance and amplitude for CoFeR magnetoresistors is superior to conventional CoFe magnetoresistors.

For CoFeB-containing junctions, distribution of TMR and RA are tighter than CoFe containing junctions. Drop in TMR at lower barrier thickness (and RA) is less severe for CoFeB containing junctions, demonstrating superior barrier quality due to the presence of grain refining agent.

Figure 6A:
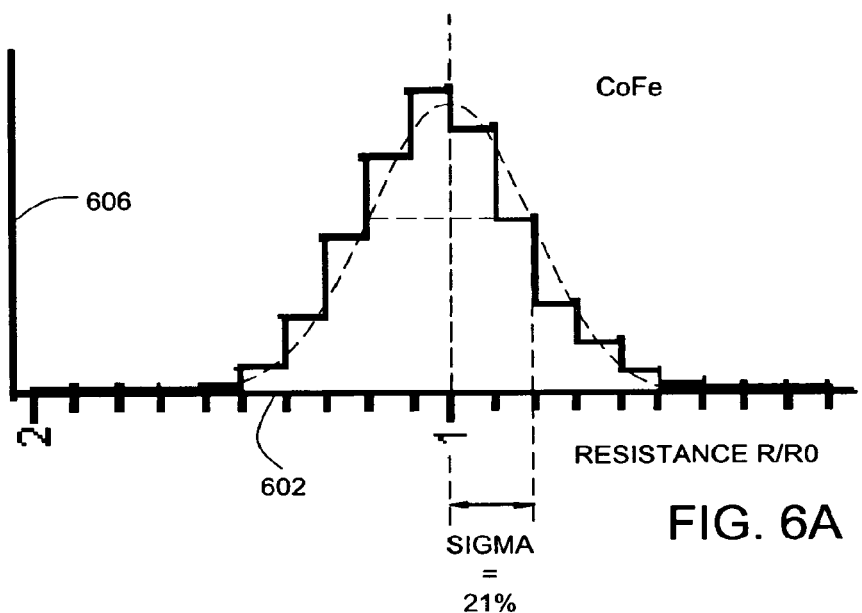
FIGS. 6A and 6B illustrate statistical variation of normalized magnetoresistance distributions for a conventional ferromagnetic layer (FIG. 6A) and for a grain-refined ferromagnetic layer (FIG. 6B).
Figure 6B:
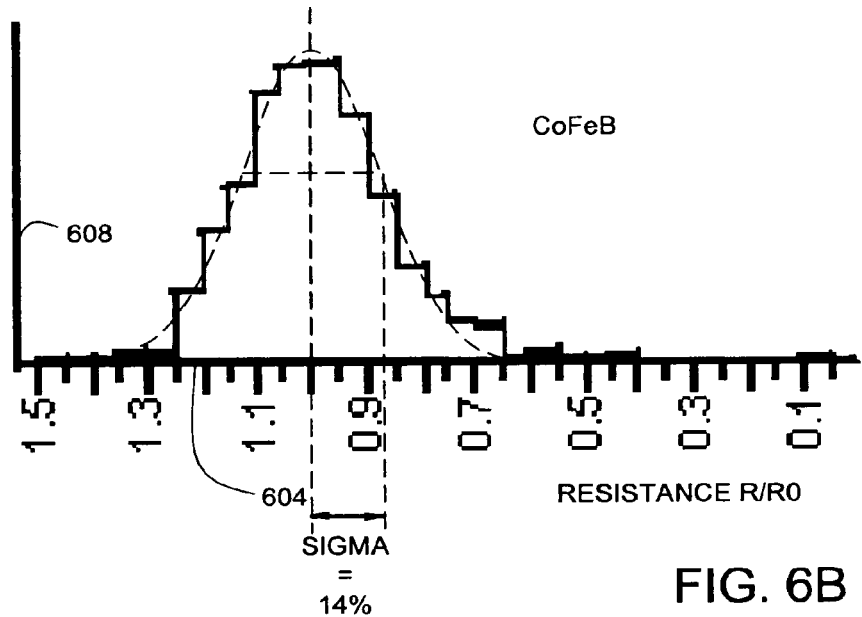

FIGS. 6A, 6B illustrate statistical variation of numerical values of normalized magnetoresistance distributions for a conventional ferromagnetic layer (FIG. 6A) and for a ferromagnetic layer that includes grain-refining agent. (FIG. 6B). The horizontal axes 602, 604 indicate numerical values of a normalized ratio of resistance to a mean resistance (R/R0). The vertical axes 606, 608 indicate statistical distribution frequency. In FIGS. 6A-6B, the barrier layer comprises $TiO_x$. Resistance variation in example lots is reduced when the grain-refining agent is used (FIG. 6B). The statistical sigma of tunnel junction with CoFeB (14%) is greatly reduced compared to CoFe (21%).

Figure 7A:
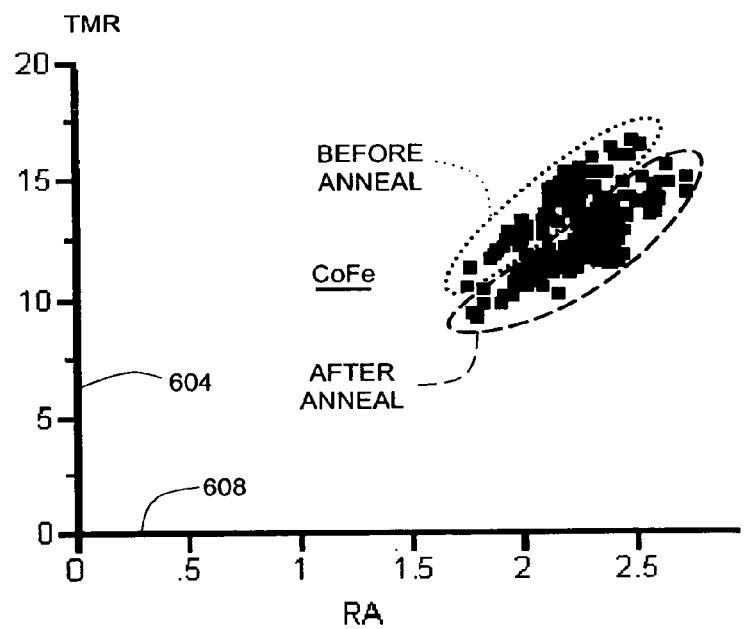
FIGS. 7A and 7B illustrate tunneling magnetoresistance as a function of resistance area product for a conventional ferromagnetic layer (FIG. 7A) and for a grain-refined ferromagnetic layer (FIG. 7B), both before and after annealing.
Figure 7B:
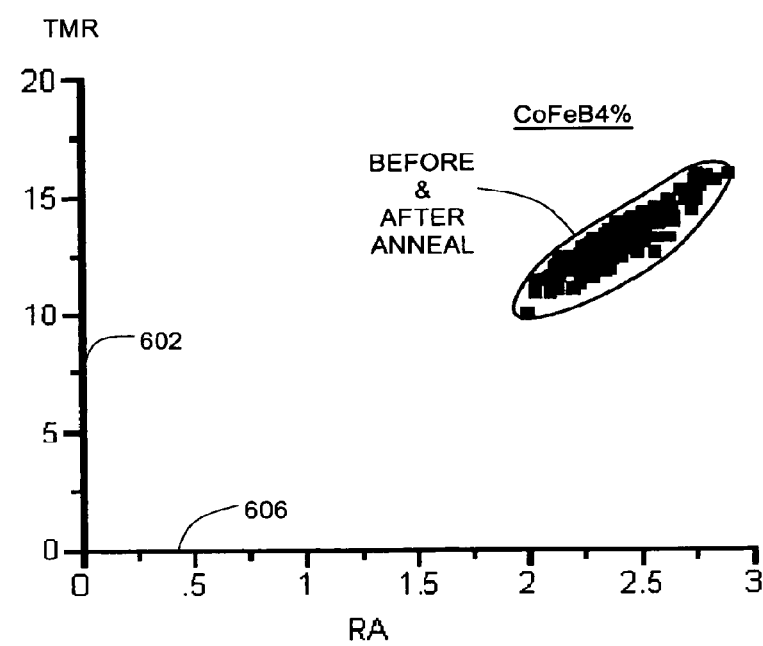

FIGS. 7A, 7B illustrate tunneling magnetoresistance as a function of resistance area product for a conventional CoFe ferromagnetic layer (FIG. 7A) and for a CoFe ferromagnetic layer with a grain refining agent (FIG. 7B), both before and after annealing. Vertical axes 602, 604 represent TMR, and horizontal axes 606, 608 represent RA. CoFeB and CoFe ferromagnet layer samples subjected to anneal conditions of 225 C and 250 C for 2 and 4 hours, respectively. For CoFeB ferromagnet, TMR and RA are unchanged by anneal. For CoFe ferromagnet, RA increases and TMR decreases.

The grain-refining agent improves thermal stability. The change in both resistance and amplitude for devices utilizing CoFeB ferromagnets are significantly improved as compared to devices utilizing a CoFe ferromagnet, both of which received an additional anneal. This is, at least in part, due to the fact that the heat of formation for boron oxidation is less exothermic than that for the oxidation of most barrier materials utilized in tunneling devices. A conclusion, which is supported by the fact that amorphous boron is frequently fabricated by reducing $B_2O_3$ in magnesium powder. Additionally, thermal stability can be further improved by utilization of CoFeR alloys as described here when adjacent a antiferromagnet (AF) layer used to pin the CoFeR layer by significantly increasing the AF/CoFeR blocking temperature over AF/CoFe alloys. Any suitable oxide for tunneling barrier could be used for the barrier layer.

Magnetic material with grain refining agent for tunneling sensors of metal oxide has high amplitude, low resistance, high thermal stability, high voltage bias breakdown, and low resistance variation in TMR structures.

The techniques described above can be applied to layered structure of magnetic sensors other than magnetoresistive sensors. For example, the arrangement shown in FIG. 2B can comprise such a magnetic sensor. Layers 244, 232 can be understood as a thin film stack of layers that includes the magnetic layer 232 comprising cobalt, iron and R where R is selected from the group: boron, niobium and hafnium. R is included at a numeric value of Y atomic %. Layer 252 can be understood as a thin film layer adjacent the thin film stack that has an electrical breakdown property with a numerical value that depends on the numerical value of Y. Layer 256 can be understood as a thin film layer adjacent the thin film stack that has various magnetoresistive properties with numerical values that depend on the numerical value of Y. Other sequences of layers or sublayers can be used in the sensor that result in at least one thin film sensor layer having at least one electrical property that has a numerical value that depends on the numerical value of Y.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the sensor system while maintaining substantially the same functionality without departing from the scope and spirit of the present invention. In addition, although the preferred embodiment described herein is directed to a tunneling magnetoresistor system for magnetic data storage, it will be appreciated by those skilled in the art that the teachings of the present invention can be applied to other sensors that include magnetic layers, without departing from the scope and spirit of the present invention.

What is claimed is:

1. An apparatus, comprising:
   a magnetoresistive sensor, comprising:
      a synthetic anti-ferromagnetic structure including a ferromagnetic reference layer comprising magnetic material and a grain refining agent, the ferromagnetic reference layer having a grain-refined reference layer surface;
      at least one additional layer adjacent the grain-refined reference layer surface,
      wherein the reference layer is a laminated structure having a plurality of layers, and wherein a first one of the plurality of layers of the laminated structure comprises the magnetic material with the grain refining agent, and wherein the first one of the plurality of layers with the grain refining agent is a nanocrystalline ferromagnetic layer that comprises cobalt (Co), iron (Fe) and the grain refining agent (R) in ratios of $(Co_{100-x}Fe_x)_{100-y}R_y$, where x is greater than zero atomic % and less than or equal to 50 atomic %, and y is in the range of 1-9 atomic %;
      a seed layer supporting the synthetic anti-ferromagnetic structure; and
      a shield layer formed of magnetic material supporting the seed layer,
      wherein the shield layer comprises the grain refining agent, and wherein the shield layer that comprises the grain refining agent is an underlying layer that is positioned below the seed layer, and
      wherein the shield layer is a laminated structure having a plurality of layers, and wherein a first one of the plurality of layers of the laminated shield layer comprises the grain refining agent and a second one of the plurality of layers of the laminated shield layer has no grain refining agent.

2. The magnetoresistive sensor of claim 1 and wherein the at least one additional layer comprises a thin film stack adjacent the grain-refined reference layer surface, the thin film stack having a stack surface that conforms to the grain-refined reference layer surface.

3. The magnetoresistive sensor of claim 2 and wherein the synthetic anti-ferromagnetic structure further comprises a pinned layer comprising magnetic material.

4. The magnetoresistive sensor of claim 3 and wherein the synthetic anti-ferromagnetic structure further comprises a non-magnetic spacer layer between the pinned layer and the reference layer.

5. The magnetoresistive sensor of claim 3 and wherein the pinned layer further comprises a grain refining agent.

6. The magnetoresistive sensor of claim 5 and further comprising a pinning layer, wherein the seed layer comprises a chemically compatible surface for receiving the pinning layer.

7. The magnetoresistive sensor of claim 6 and wherein the thin film stack comprises a barrier layer with a first barrier layer surface that conforms to the grain-refined reference layer surface.

8. The magnetoresistive sensor of claim 7 and wherein the thin film stack further comprises a first free layer that is adjacent the barrier layer.

9. The magnetoresistive sensor of claim 8 and wherein the first free layer comprises a grain refining agent.

10. The magnetoresistive sensor of claim 8 and wherein the thin film stack further comprises a second free layer that is adjacent the first free layer.

11. The magnetoresistive sensor of claim 10 and wherein a chemical composition of the first free layer is different from a chemical composition of the second free layer.

12. The magnetoresistive sensor of claim 11 and wherein the second free layer comprises a grain refining agent.

13. The magnetoresistive sensor of claim 10 and wherein the thin film stack further comprises a third free layer that is adjacent the second free layer.

14. The magnetoresistive sensor of claim 1 and wherein the grain refining agent comprises Boron.

15. The magnetoresistive sensor of claim 1 and wherein the plurality of layers in the laminated structure further comprises a second layer with no grain refining agent and a third layer with no grain refining agent.

16. An apparatus, comprising:
a magnetoresistive sensor, comprising:
   a synthetic anti-ferromagnetic structure including a nano-crystalline ferromagnetic reference layer comprising cobalt (Co), iron (Fe) and boron (B) in ratios $(Co_{100-x}Fe_x)_{100-y}B_y$, where B is a grain refining agent, x is greater than zero atomic % and less than or equal to 50 atomic %, and y is in the range of 1-9 atomic %, the ferromagnetic reference layer having a grain-refined reference layer surface; and
   a thin film stack adjacent the grain-refined reference layer surface, the thin film stack comprises:
      a barrier layer with a first barrier layer surface that conforms to the grain-refined reference layer surface;
      a free layer structure comprising a plurality of layers with at least one of the plurality of layers comprising a magnetic material and the grain refining agent;
a seed layer supporting the synthetic anti-ferromagnetic structure; and
a shield layer formed of magnetic material supporting the seed layer,
wherein the shield layer comprises the grain refining agent, and wherein the shield layer that comprises the grain refining agent is an underlying layer that is positioned below the seed layer, and
wherein the shield layer is a laminated structure having a plurality of layers, and wherein a first one of the plurality of layers of the laminated shield layer comprises the grain refining agent and a second one of the plurality of layers of the laminated shield layer has no grain refining agent.

17. An apparatus, comprising:
a magnetoresistive sensor, comprising:
   a synthetic anti-ferromagnetic structure including a nano-crystalline ferromagnetic reference layer comprising cobalt (Co), iron (Fe) and boron (B) in ratios $(Co_{100-x}Fe_x)_{100-y}B_y$, where B is a grain refining agent, x is greater than zero atomic % and less than or equal to 50 atomic %, and y is in the range of 1-9 atomic %, the ferromagnetic reference layer having a grain-refined reference layer surface; and
   a thin film stack adjacent the grain-refined reference layer surface, the thin film stack having a stack surface that conforms to the grain-refined reference layer surface, the thin film stack comprising a plurality of layers with at least one of the plurality of layers comprising Co, Fe and B;
a seed layer supporting the synthetic anti-ferromagnetic structure; and
a shield layer formed of magnetic material supporting the seed layer,
wherein the shield layer comprises the grain refining agent, and wherein the shield layer that comprises the grain refining agent is an underlying layer that is positioned below the seed layer, and
wherein the shield layer is a laminated structure having a plurality of layers, and wherein a first one of the plurality of layers of the laminated shield layer comprises the grain refining agent and a second one of the plurality of layers of the laminated shield layer has no grain refining agent.

* * * * *